(12) United States Patent
Ye

(10) Patent No.: US 11,151,354 B2
(45) Date of Patent: Oct. 19, 2021

(54) FINGERPRINT IDENTIFICATION MODULE AND ELECTRONIC DEVICE

(71) Applicant: VIVO MOBILE COMMUNICATION CO., LTD., Guangdong (CN)

(72) Inventor: Jinshan Ye, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 0 days.

(21) Appl. No.: 16/958,581

(22) PCT Filed: Dec. 29, 2018

(86) PCT No.: PCT/CN2018/125407
§ 371 (c)(1),
(2) Date: Jun. 26, 2020

(87) PCT Pub. No.: WO2019/129265
PCT Pub. Date: Jul. 4, 2019

(65) Prior Publication Data
US 2020/0356749 A1 Nov. 12, 2020

(30) Foreign Application Priority Data
Dec. 29, 2017 (CN) .......................... 201711475779.2

(51) Int. Cl.
*G06K 9/00* (2006.01)
*H01L 27/32* (2006.01)
*H01L 51/52* (2006.01)

(52) U.S. Cl.
CPC ....... *G06K 9/0004* (2013.01); *G06K 9/00053* (2013.01); *H01L 27/323* (2013.01); *H01L 51/5253* (2013.01)

(58) Field of Classification Search
CPC ............. G06K 9/0004; G06K 9/00053; G06K 9/2018; G06K 9/00046; H01L 27/323; H01L 51/5253
See application file for complete search history.

(56) References Cited

U.S. PATENT DOCUMENTS

2008/0121442 A1    5/2008  Boer et al.
2017/0169273 A1    6/2017  Wu
(Continued)

FOREIGN PATENT DOCUMENTS

CN    202647304 U    1/2013
CN    103943645 A    7/2014
(Continued)

OTHER PUBLICATIONS

CN Search Report in Application No. 201711475779.2 dated Nov. 16, 2018.
(Continued)

*Primary Examiner* — Abhishek Sarma
(74) *Attorney, Agent, or Firm* — Maschoff Brennan

(57) ABSTRACT

A fingerprint identification module and an electronic device are provided. The electronic device includes a screen assembly provided with a glass substrate. The fingerprint identification module includes: a color filter coating applied onto the glass substrate; an optical collimator arranged at a side of the color filter coating away from the glass substrate; and an image sensor arranged at a side of the optical collimator away from the color filter coating.

8 Claims, 2 Drawing Sheets

(56) References Cited

U.S. PATENT DOCUMENTS

2017/0220844 A1* 8/2017 Jones ................... G06F 3/0421
2017/0364763 A1* 12/2017 Jin ......................... G06F 21/32

FOREIGN PATENT DOCUMENTS

| CN | 204258907 U | 4/2015 |
| CN | 104615979 A | 5/2015 |
| CN | 106874828 A | 6/2017 |
| CN | 106960201 A | 7/2017 |
| CN | 107092492 A | 8/2017 |
| CN | 107958237 A | 4/2018 |
| EP | 3 258 408 A1 | 12/2017 |

OTHER PUBLICATIONS

Written Opinion and International Search Report in Application No. PCT/CN2018/125407 dated Jul. 9, 2020.
EP Search Report in Application No. 18894137.1 dated Jan. 25, 2021.

* cited by examiner

FINGERPRINT IDENTIFICATION MODULE AND ELECTRONIC DEVICE

CROSS-REFERENCE TO RELATED APPLICATION

The present application is the U.S. national phase of PCT Application No. PCT/CN2018/125407 filed on Dec. 29, 2018, which claims a priority of the Chinese patent application No. 201711475779.2 filed on Dec. 29, 2017, which is incorporated herein by reference in its entirety.

TECHNICAL FIELD

The present disclosure relates to the field of smart devices, in particular to a fingerprint identification module and an electronic device.

BACKGROUND

Along with the development of the fingerprint identification technology, an electronic device is provided with no physical fingerprint position, and an in-screen fingerprint identification technology has become a new trend. When the electronic device is provided with a relatively large screen-to-body ratio, it is able to improve the appearance as well as the user's visual experience. An optical fingerprint identification technology is used to achieve the fingerprint identification at a display region of a screen in an under-display manner on the basis of optical characteristics. As a fingerprint imaging principle of the optical fingerprint identification technology, light beams are transmitted by a transmitting unit toward a finger, and an energy difference is sensed by an under-display receiving unit because different energy levels of the light beams are absorbed and reflected by ridges and valleys of a fingerprint, so as to generate fringes with different brightness values, i.e., fingerprint image information.

As shown in FIG. 1, in basic architecture of a conventional under-display fingerprint identification module, an Organic Light-Emitting Diode (OLED) is used as the transmitting unit, i.e., a light source. When the screen is touched by a finger 100, a light beam transmitted by the OLED is reflected or refracted, and the reflected light beam is received by an optical fingerprint identification module arranged under the screen so as to achieve the under-display fingerprint identification. The fingerprint identification module 101 is attached onto a screen assembly 102 through an adhesive 103, and it includes a bracket 1011, an infrared (IR) color filter 1012, an optical collimator 1013, a sealant 1014 and image sensor 1015. The optical collimator 1013 is mainly used for collimate the reflected light through a collimating aperture toward the image sensor 1015, so as to achieve optical energy isolation with respect to light beams for pixels of the image sensor 1015, thereby to prevent the occurrence of light crosstalk among the sensing pixels. The IR color filter 1012 includes a glass base substrate and an IR material coating, so as to prevent the IR interference caused by external sunlight, thereby to prevent the failure of the fingerprint identification due to the intensive light when a user is outdoors.

As a main drawback, the optical fingerprint identification module is susceptible to the intensive light. Hence, the fingerprint identification module 101 needs to perform infrared filtration through the IR color filter 1012, so as to prevent the infrared light from interfering with the image sensor 1015. Generally, the fingerprint identification module 101 has a separate structure of glass color filter, and the color filter is arranged above the fingerprint identification module 101 for the infrared filtration. However, the color filter has a thickness of about 0.11 mm, resulting in a constraint to a space design of the electronic device to some extent.

SUMMARY

In one aspect, the present disclosure provides a fingerprint identification module for an electronic device, the electronic device including a screen assembly provided with a glass substrate, the fingerprint identification module including: a color filter coating applied onto the glass substrate; an optical collimator arranged at a side of the color filter coating away from the glass substrate; and an image sensor arranged at a side of the optical collimator away from the color filter coating.

In another aspect, the present disclosure provides in some embodiments an electronic device including the above-mentioned fingerprint identification module.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
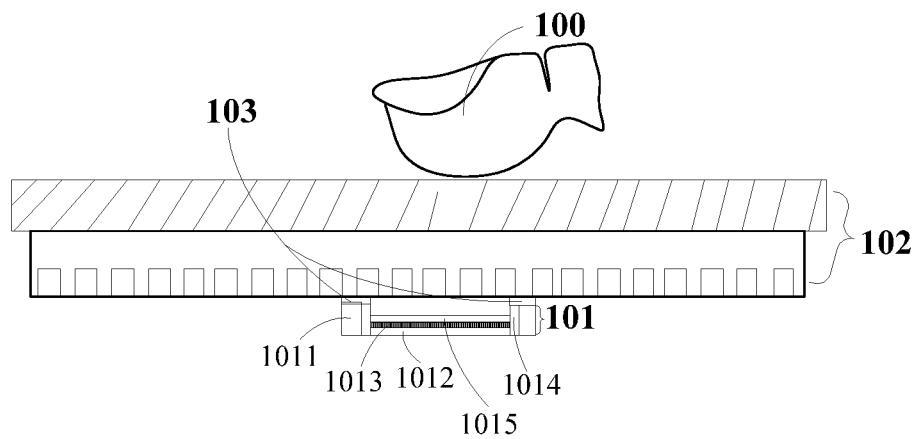
FIG. 1 is a schematic view showing a fingerprint identification module in the related art.

REFERENCE SIGN LIST 100 finger
101 fingerprint identification module
102 screen assembly
103 adhesive
1011 bracket
1012 IR color filter
1013 optical collimator
1014 sealant
1015 image sensor
201 screen assembly
202 color filter coating
203 optical collimator
204 image sensor
205 module bracket
206 protection coating
2011 glass substrate
2012 OLED panel unit
2013 glass cover plate

DETAILED DESCRIPTION

The present disclosure will be described hereinafter in conjunction with the drawings and embodiments. The following embodiments are for illustrative purposes only, but shall not be used to limit the scope of the present disclosure.

Actually, the embodiments are provided so as to facilitate the understanding of the scope of the present disclosure.

In the embodiments of the present disclosure, such words as "in the middle of", "longitudinal", "lateral", "length", "width", "thickness", "on/above", "under/below", "front", "back", "left", "right", "vertical", "horizontal", "top", "bottom", "inside", "outside", "clockwise", "counter-clockwise", "axial", "radial" and "circumferential" may be used to indicate directions or positions as viewed in the drawings, and they are merely used to facilitate the description in the present disclosure, rather than to indicate or imply that a device or member must be arranged or operated at a specific position.

In addition, such words as "first" and "second" are merely used to differentiate different components rather than to represent any order, number or importance, i.e., they are used to implicitly or explicitly indicate that there is at least one component. Further, such a phrase as "a plurality of" is used to indicate that there are at least two, e.g., two or three, components, unless otherwise specified.

Unless otherwise specified, such words as "arrange", "connect" and "fix" may have a general meaning, e.g., the word "connect" may refer to fixed connection, removable connection or integral connection, or mechanical or electrical connection, or direct connection or indirect connection via an intermediate component, or communication between two components, or wired or wireless communication connection. The meanings of these words may be understood by a person skilled in the art in accordance with the practical need.

Unless otherwise defined, when one member is arranged on or under another member, the member may be in contact with the other member directly or via an intermediate member. In addition, when one member is arranged on/above another member, the member may be arranged right on/above the other member or not, or it merely means that the member is located at a level higher than the other member. When one member is arranged under/below another member, the member may be arranged right under/below the other member or not, or it merely means that the member is located at a level lower than the other member.

An object of the present disclosure is to provide a fingerprint identification module and an electronic device, so as to solve the problem in the related art where a thickness of the entire fingerprint identification module increases and a space design of the electronic device is limited due to a structural thickness of a color filter in the fingerprint identification module.

Figure 2:
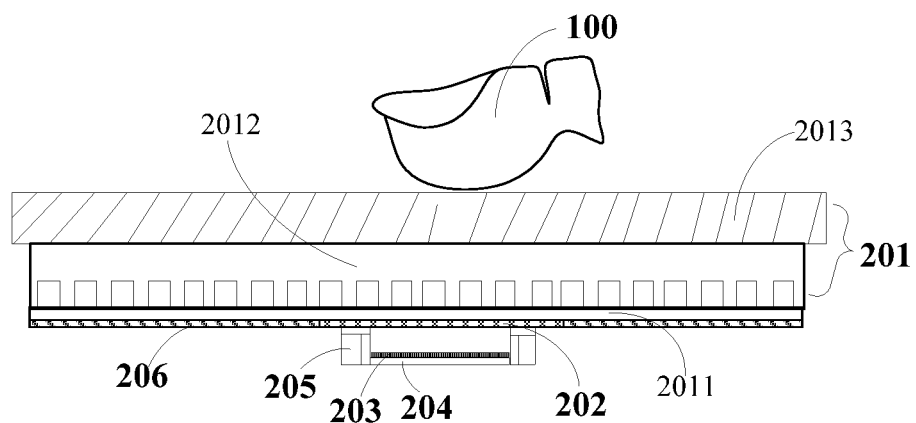
FIG. 2 is a schematic view showing a fingerprint identification module according to one embodiment of the present disclosure.

As shown in FIG. 2, the present disclosure provides in some embodiments a fingerprint identification module for an electronic device. The electronic device includes a screen assembly 201 provided with a glass substrate 2011. The fingerprint identification module includes a color filter coating 202, an optical collimator 203 and an image sensor 204. The color filter coating 202 is applied onto the glass substrate 2011, the optical collimator 203 is arranged at a side of the color filter coating 202 away from the glass substrate 2011, and the image sensor 204 is arranged at a side of the optical collimator 203 away from the color filter coating 202. In the fingerprint identification module, the optical collimator 203 and the image sensor 204 may be encapsulated to form an encapsulation structure, and the color filter coating 202 may be applied onto the glass substrate 2011 to form a color filter structure capable of preventing the interference caused by external intensive light. In this way, the color filter structure may be separated from the encapsulation structure of the fingerprint identification module, and the color filter coating 202 may be directly attached onto the glass substrate 2011 at an inner side of the screen assembly 201 (a side of the screen assembly 201 facing a user is an outer side, and a side of the screen assembly 201 mounted on a middle frame structure is the inner side). As a result, it is unnecessary to provide a color filter structure in the encapsulation structure of the fingerprint identification module in a conventional scheme, so it is able to reduce a thickness of the entire fingerprint identification module.

In the embodiments of the present disclosure, the fingerprint identification module may further include a module bracket 205 onto which the optical collimator 203 and the image sensor 204 are installed. The module bracket 205 may be fixed onto the glass substrate 2011 at a position where the color filter coating 202 is applied. In other words, the optical collimator 203 and the image sensor 204 may be encapsulated through the module bracket 205 to form the encapsulation structure, and then fixed onto the glass substrate 2011 through the module bracket 205. Further, an edge of each of the optical collimator 203 and the image sensor 204 may be fixed onto the module bracket 205. To be specific, the edge of each of the optical collimator 203 and the image sensor 204 may be adhered to the module bracket 205 through an adhesive, and the module bracket 205 may be adhered onto the glass substrate 2011 through an adhesive too.

Figure 3:
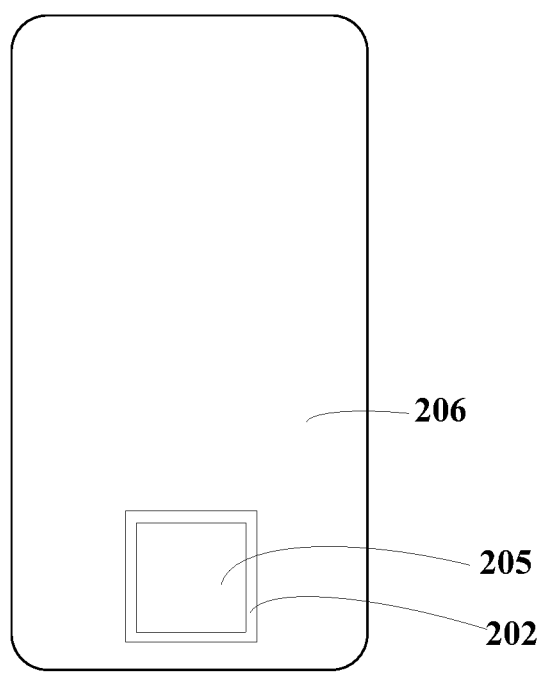
FIG. 3 is a schematic view showing a position relationship between a color filter coating and a module bracket in FIG. 2.

Further, as shown in FIG. 3, an area of the color filter coating 202 may be greater than or equal to an installation coverage area of the module bracket 205 and the glass substrate 2011, i.e., greater than or equal to an area of an upper surface of the encapsulation structure of the fingerprint identification module. In this way, after the fingerprint identification module has been adhered onto the glass substrate, it is able for the color filter coating 202 to prevent the intensive light from interfering with the fingerprint identification module in a more efficient manner.

As shown in FIG. 2, the screen assembly 201 may further include an OLED panel unit 2012 arranged at a side of the glass substrate 2011 away from the color filter coating 202, and a glass cover plate 2013 arranged at a side of the OLED panel unit 2012 away from the glass substrate 2011. The OLED panel unit 2012 may serve as a light source. When a panel is touched by the finger 100, a light beam emitted by the OLED panel unit 201 may be reflected or refracted, and the reflected light beam may be received by the fingerprint identification module under the screen assembly, so as to achieve the under-display fingerprint identification. To be specific, the OLED panel unit 2012 may be provided with at least one OLED, and the quantity and an arrangement mode of the OLEDs will not be particularly defined herein.

As shown in FIG. 2, a protection coating 206 may be applied to a side of the glass substrate 2011 away from the OLED panel unit 2012 at a region other than the region where the color filter coating 202 is located. In other words, a protection film may be applied onto the glass substrate 2011 other than the region where the color filter layer 202 is located. During the manufacture, before the application of the color filter coating 202, a certain region of the glass substrate may be exposed, and the color filter coating 202 may be applied to the certain region.

According to the fingerprint identification module in the embodiments of the present disclosure, the color filter coating may be applied onto the glass substrate of the screen assembly, i.e., it is unnecessary to provide a separate color filter as compared with a conventional fingerprint identification module, so it is able to reduce a structural thickness of the fingerprint identification module, thereby to release a design space of the electronic device. Further, the area of the color filter coating may be greater than the area of installation surface of the encapsulation structure in the fingerprint identification module, so it is able to prevent the leakage of infrared light due to the encapsulation of the color filter in the fingerprint identification module, thereby to improve the resistance to intensive light.

The present disclosure further provides in some embodiments an electronic device which includes the above-mentioned fingerprint identification module. The implementation of the electronic device may refer to that of the fingerprint identification module with a same technical effect. The electronic device may be a mobile phone, a laptop computer, a Personal Digital Assistant (PDA), a vehicle-mounted computer, a music player, an e-book or a navigator. According to the electronic device in the embodiments of the present disclosure, the color filter coating may be applied onto the glass substrate of the screen assembly, i.e., it is unnecessary to provide a separate color filter as compared with the conventional fingerprint identification module, so it is able to reduce the structural thickness of the fingerprint identification module, thereby to release the design space of the electronic device.

The above embodiments have been described in a progressive manner, and the same or similar contents in the embodiments will not be repeated, i.e., each embodiment merely focuses on the difference from the others.

Although the preferred embodiments are described above, a person skilled in the art may make modifications and alterations to these embodiments in accordance with the basic concept of the present disclosure. So, the appended claims are intended to include the preferred embodiments and all of the modifications and alterations that fall within the scope of the present disclosure.

It should be further appreciated that, such words as "first" and "second" are merely used to separate one entity or operation from another entity or operation, but are not necessarily used to represent or imply any relation or order between the entities or operations. In addition, such terms as "include" or "including" or any other variations involved in the present disclosure intend to provide non-exclusive coverage, so that a procedure, method, article or device including a series of elements may also include any other elements not listed herein, or may include any inherent elements of the procedure, method, article or device. If without any further limitations, for the elements defined by such sentence as "including one . . . ", it is not excluded that the procedure, method, article or device including the elements may also include any other identical elements.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A fingerprint identification module applied for an electronic device, wherein the electronic device comprises a screen assembly (201) provided with a glass substrate (2011), the fingerprint identification module comprises:
   a color filter coating (202) applied onto the glass substrate (2011);
   an optical collimator (203) arranged at a side of the color filter coating (202) away from the glass substrate (2011);
   an image sensor (204) arranged at a side of the optical collimator (203) away from the color filter coating (202); and
   a module bracket (205), wherein the optical collimator (203) and the image sensor (204) are installed onto the module bracket (205), and the module bracket (205) is fixed onto the glass substrate (2011) at a position where the color filter coating (202) is applied;
   wherein an area of the color filter coating (202) is greater than or equal to an installation coverage area of the module bracket (205) and the glass substrate (2011).

2. The fingerprint identification module according to claim 1, wherein an edge of each of the optical collimator (203) and the image sensor (204) is fixed onto the module bracket (205).

3. The fingerprint identification module according to claim 2, wherein the edge of each of the optical collimator (203) and the image sensor (204) is adhered onto the module bracket (205), and the module bracket (205) is adhered onto the glass substrate (2011).

4. The fingerprint identification module according to claim 1, wherein the screen assembly (201) further comprises an Organic Light-Emitting Diode (OLED) panel unit arranged at a side of the glass substrate (2011) away from the color filter coating (202) and a glass cover plate (2013) arranged at a side of the OLED panel unit away from the glass substrate (2011).

5. The fingerprint identification module according to claim 4, wherein the OLED panel unit (2012) is provided with at least one OLED.

6. The fingerprint identification module according to claim 4, wherein a protection coating (206) is applied to a side of the glass substrate (2011) away from the OLED panel unit (2012) at a region other than a region where the color filter coating (202) is located.

7. An electronic device, comprising the fingerprint identification module according to claim 1.

8. The electronic device according to claim 7, wherein the electronic device is a mobile phone, a laptop computer, a personal digital assistant, a vehicle-mounted computer, a music player, an e-book or a navigator.

* * * * *